United States Patent
Saito et al.

(10) Patent No.: US 6,204,356 B1
(45) Date of Patent: Mar. 20, 2001

(54) POLYBENZOXAZOLE RESIN AND PRECURSOR THEREOF

(75) Inventors: Hidenori Saito, Yokohama; Michio Nakajima, Kawasaki, both of (JP); Tsuyoshi Watanabe, Boston, MA (US); Maki Tokuhiro, Kawasaki (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 0 days.

(21) Appl. No.: 09/404,156

(22) Filed: Sep. 27, 1999

(30) Foreign Application Priority Data

Sep. 29, 1998 (JP) .................................................. 10-275185

(51) Int. Cl.$^7$ .................................................. C08G 73/22
(52) U.S. Cl. .......................... 528/327; 528/183; 528/171; 528/172; 528/173; 528/174; 528/176; 528/185; 528/332; 528/345; 528/348; 528/360; 528/372; 525/434
(58) Field of Search ...................................... 528/327, 174, 528/176, 171, 172, 173, 183, 185, 332, 345, 372, 348, 360; 525/434

(56) References Cited

U.S. PATENT DOCUMENTS

| | | | |
|---|---|---|---|
| 4,939,215 | 7/1990 | Mueller et al. | 525/434 |
| 5,422,416 | 6/1995 | So | 528/179 |
| 5,449,584 | 9/1995 | Banba et al. | 430/190 |
| 5,492,996 | * 2/1996 | Dang et al. | 528/171 |
| 5,493,005 | * 2/1996 | Arnold et al. | 528/341 |
| 5,498,784 | * 3/1996 | Arnold et al. | 528/337 |
| 5,534,614 | * 7/1996 | O'Briem et al. | 528/183 |

FOREIGN PATENT DOCUMENTS

| | | |
|---|---|---|
| 0 905 170 | 3/1999 | (EP) . |
| 2 595 362 | 3/1987 | (FR) . |
| 62-207332 | 9/1987 | (JP) . |
| 63-318 | 1/1988 | (JP) . |

OTHER PUBLICATIONS

*Chemical Abstracts*, vol. 106, No. 67818y to Ignatenko, et al. dated Mar., 1987.
Copy of International Search Report for the related PCT parent application.

* cited by examiner

*Primary Examiner*—P. Hampton-Hightower
(74) *Attorney, Agent, or Firm*—Smith, Gambrell & Russell, LLP

(57) ABSTRACT

Heat resistant polybenzoxazole resins useful as layer insulation films and protective films for semiconductor, layer insulation films for multilayer circuits, cover coats for flexible copper-clad sheets, solder resist films, liquid crystal-aligned films and the like. These resins have excellent thermal, electrical, physical and mechanical characteristics. Polybenzoxazole precursors are provided, represented by the general formula (A), and are used to obtain polybenzoxazole resins, represented by the general formula (D). In the formulas (A) and (D), n denotes an integer from 2–1000, and X denotes a structure having a formula selected from structures indicated at (B). In the formulas at (B), Y denotes a structure having a formula selected from those indicated at (C), and the hydrogen atom(s) on the benzene ring in these structures are optionally substituted.

2 Claims, No Drawings

POLYBENZOXAZOLE RESIN AND PRECURSOR THEREOF

TECHNICAL FIELD

The present invention relates to polybenzoxazole resins which are excellent in thermal characteristics, electrical characteristics, mechanical characteristics, and physical characteristics, and which are usable as layer insulation films and protective films for semiconductors, layer insulation films of multilayer circuits, cover coats of flexible copper-clad sheets, solder resist films, liquid crystal-aligned films, etc.

BACKGROUND ART

Hitherto, inorganic insulation films of silicon dioxide or the like prepared by chemical vapor deposition method or the like have been used as layer insulation films for semi-conductors. However, inorganic insulation films of silicon dioxide or the like are high in dielectric constant, and use of organic materials is being investigated as insulation films for the purposes of speeding up and higher performance. As organic materials for semiconductors, there are used poly-imide resins which are superior in heat resistance, electrical characteristics and mechanical characteristics. With recent enhancement in function and performance of semiconductors, further remarkable improvement in heat resistance, electrical characteristics, moisture-absorption characteristics, and thermal expansion coefficient is demanded, and thus, resins of further higher performances are needed.

Under the circumstances, it has been attempted to use polybenzoxazole resins which are superior to polyimide resins in water absorption and electrical characteristics, as insulation materials for semiconductors. It is easy for poly-benzoxazole resins to satisfy only one of thermal characteristics, electrical characteristics, mechanical characteristics and physical characteristics. For example, a poly-benzoxazole resin comprising 4,4'-diamino-3,3'-dihydroxybiphenyl and terephthalic acid has much superior heat resistance such as high heat decomposition resistance or high Tg, but is not so good in electrical characteristics such as dielectric constant and dielectric loss tangent. A polyben-zoxazole resin comprising 2,2'-bis(3-amino-4-hydroxyphenyl)hexafluoropropane and terephthalic acid shows good electrical characteristics such as low dielectric constant, but is not so good in heat resistance and physical characteristics. Thus, at present, there are obtained no resins which are excellent in all of thermal characteristics, electri-cal characteristics, mechanical characteristics and physical characteristics.

DISCLOSURE OF THE INVENTION

The object of the present invention is to provide heat resistant resins excellent in all of thermal characteristics, electrical characteristics, physical characteristics and mechanical characteristics in use for semiconductors.

As a result of intensive research conducted in an attempt to solve the above problems, the inventors have found a polybenzoxazole precursor represented by the following general formula (A) and a polybenzoxazole resin repre-sented by the following general formula (D), and have accomplished the present invention.

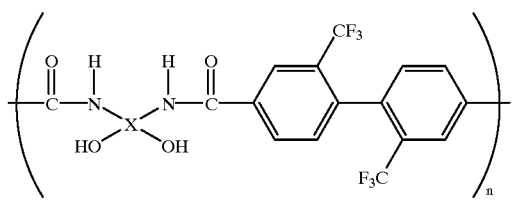

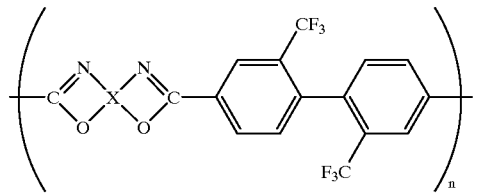

In the above formulas (A) and (D), n denotes an integer of 2–1000 and X denotes a structure selected from those represented by the following formulas (B):

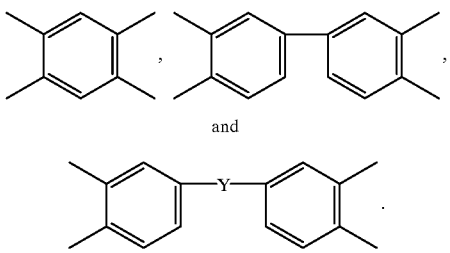

In the above formulas (B), Y denotes a structure selected from those represented by the following formulas (C), and the hydrogen atom(s) on the benzene ring in these structures may be substituted with at least one group selected from the group consisting of methyl group, ethyl group, propyl group, isopropyl group, butyl group, isobutyl group, t-butyl group, fluorine atom and trifluoromethyl group:

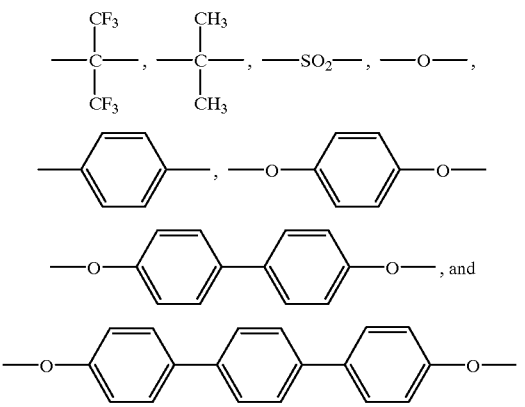

DETAILED DESCRIPTION OF THE INVENTION

The polybenzoxazole precursor of the present invention can be obtained from a bisaminophenol compound having one of the structures represented by the above formulas (B) and 2,2'-bis(trifluoromethyl)-4,4'-biphenylenedicarboxylic acid by conventional methods such as acid chloride method, activated ester method, and condensation reaction in the presence of a dehydration condensation agent such as polyphosphoric acid or dicyclohexylcarbodiimide.

Typical examples of the bisaminophenol compound having one of the structures represented by the formulas (B) which is used in the present invention, are 2,4-diaminoresorcinol, 4,6-diaminoresorcinol, 2,2'-bis(3-amino-4-hydroxyphenyl)hexafluoropropane, 2,2'-bis(4-amino-3-hydroxyphenyl)hexafluoropropane, 2,2'-bis(3-amino-4-hydroxyphenyl)propane, 2,2'-bis(4-amino-3-hydroxyphenyl)propane, 3,3'-diamino-4,4'-dihydroxydiphenyl sulfone, 4,4'-diamino-3,3'-dihydroxydiphenyl sulfone, 3,3'-diamino-4,4'-dihydroxybiphenyl, 4,4'-diamino-3,3'-dihydroxybiphenyl, 3,3'-diamino-4,4'-dihydroxydiphenyl ether, 4,4'-diamino-3,3'-dihydroxydiphenyl ether, 2,2'-bis(3-amino-4-hydroxy-2-trifluoromethyl)propane, 2,2'-bis(4-amino-3-hydroxy-2-trifluoromethyl)propane, 2,2'-bis(3-amino-4-hydroxy-5-trifluoromethyl)propane, 2,2'-bis(4-amino-3-hydroxy-5-trifluoromethyl)propane, 2,2'-bis(3-amino-4-hydroxy-6-trifluoromethyl)propane, 2,2'-bis(4-amino-3-hydroxy-6-trifluoromethyl)propane, 2,2'-bis(3-amino-4-hydroxy-2-trifluoromethyl)hexafluoropropane, 2,2'-bis(4-amino-3-hydroxy-2-trifluoromethyl)hexafluoropropane, 2,2'-bis(3-amino-4-hydroxy-5-trifluoromethyl)hexafluoropropane, 2,2'-bis(4-amino-3-hydroxy-5-trifluoromethyl)hexafluoropropane, 2,2'-bis(3-amino-4-hydroxy-6-trifluoromethyl)hexafluoropropane, 2,2'-bis(4-amino-3-hydroxy-6-trifluoromethyl)hexafluoropropane, 3,3'-diamino-4,4'-dihydroxy-2,2'-trifluoromethylbiphenyl, 4,4'-diamino-3,3'-dihydroxy-2,2'-trifluoromethylbiphenyl, 3,3'-diamino-4,4'-dihydroxy-5,5'-trifluoromethylbiphenyl, 4,4'-diamino-3,3'-dihydroxy-5,5'-trifluoromethylbiphenyl, 3,3'-diamino-4,4'-dihydroxy-6,6'-trifluoromethylbiphenyl, and 4,4'-diamino-3,3'-dihydroxy-6,6'-trifluoromethylbiphenyl.

Among the methods for producing polybenzoxazole precursors of the present invention, for example, according to the acid chloride method, first, 2,2'-bis(trifluoromethyl)-4,4'-biphenylenedicarboxylic acid chloride which is an acid chloride used, can be obtained by reacting 2,2'-bis(trifluoromethyl)-4,4'-biphenylenedicarboxylic acid, in the presence of a catalyst such as N,N-dimethylformamide, with thionyl chloride in an excess amount at a temperature of room temperature to 75° C., distilling off excess thionyl chloride by heating under reduced pressure, and then recrystallizing the resulting residue by use of a solvent such as hexane. Then, the polybenzoxazole precursor can be obtained by dissolving a bisaminophenol compound usually in a polar solvent such as N-methyl-2-pyrrolidone or N,N-dimethylacetamide, followed by reacting with the 2,2'-bis(trifluoromethyl)-4,4'-biphenylenedicarboxylic acid chloride at a temperature of room temperature to −30° C. in the presence of an acid-acceptor such as pyridine.

The polybenzoxazole resin of the present invention can be obtained by subjecting the resulting polybenzoxazole precursor to condensation reaction by heating or treating with a dehydrating agent in the conventional manner. If necessary, various additives such as surface active agents and coupling agents are added to the resulting resin, and this can be used as layer insulation films and protective films for semiconductors, layer insulation film of multilayer circuits, cover coats of flexible copper-clad sheets, solder resist films, liquid crystal-aligned films, etc.

Furthermore, the precursor of the polybenzoxazole resin in the present invention can be used together with a naphthoquinonediazide compound as a photosensitive agent to provide a photosensitive resin composition.

The polybenzoxazole precursor of the present invention is preferably used in the state of varnish usually by dissolving it in a solvent. Examples of the solvent are N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, and methyl-3-methoxy propionate. These can be used each alone or in admixture of two or more.

The polybenzoxazole precursor of the present invention can be used in the following manner. First, the precursor and other compounds are dissolved in the above solvent, and the solution is coated on a suitable support such as silicon wafer and ceramic substrate. As the coating method, mention may be made of spin coating with a spinner, spray coating with a spray coater, dipping, printing, roll coating, etc. After formation of a coating film in this way, the film is preferably heat-treated to convert it to a polybenzoxazole resin.

BEST MODE FOR CARRYING OUT THE INVENTION

The present invention will be explained in more detail by way of the following examples. It should be understood that they are exemplary only, and should not be construed as limiting the invention in any manner. Hereinafter "parts" means "parts by weight".

EXAMPLE 1

73.2 Parts (0.2 mol) of 2,2'-bis(3-amino-4-hydroxyphenyl)hexafluoropropane was dissolved in 200 parts of dried dimethylacetamide, and 39.6 parts (0.5 mol) of pyridine was added to the solution, followed by adding dropwise thereto a solution of 83.0 parts (0.2 mol) of 2,2'-bis(trifluoromethyl)-4,4'-biphenylenedicarboxylic acid chloride in 100 parts of cyclohexane at −15° C. in dry nitrogen over a period of 30 minutes. After completion of the addition, the temperature was restored to room temperature, followed by stirring at room temperature for 5 hours. Then, the reaction mixture was added dropwise to 7 liters of distilled water, and the precipitate was collected and dried to obtain a polybenzoxazole precursor (formula (E)). The resulting polybenzoxazole precursor had a number-average molecular weight (Mn) of 44000 obtained in terms of polystyrene using GPC manufactured by Toso Co., Ltd.

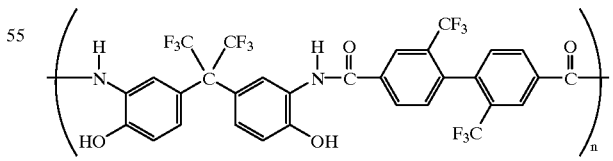

(E)

This polybenzoxazole precursor was dissolved in N-methyl-2-pyrrolidone, and the solution was filtered with a Teflon filter of 0.2 μm to obtain a varnish.

This varnish was coated on a glass sheet by a doctor blade. Then, this was dried at 70° C. for 1 hour in an oven, and the coat was peeled off to obtain a polybenzoxazole precursor film of 20 μm thickness. This film was fixed by a metal frame and heated at 150° C./30 minutes, 250° C./30 minutes and 350° C./30 minutes successively in this order to obtain a polybenzoxazole resin (formula (F)).

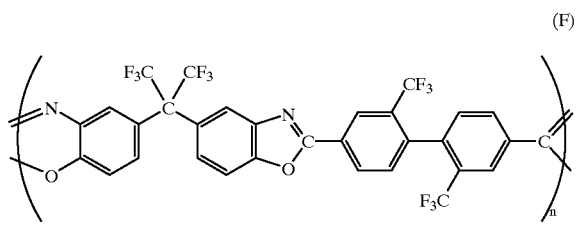

(F)

This resin film was evaluated on various properties, and the results are shown in Table 1.

EXAMPLE 2

A polybenzoxazole resin (formula (G)) was prepared in the same manner as in Example 1, except that 43.2 parts (0.2 mol) of 4,4'-diamino-3,3'-dihydroxybiphenyl was used in place of 73.2 parts (0.2 mol) of 2,2'-bis(3-amino-4-hydroxyphenyl)hexafluoropropane in Example 1, and was evaluated on the properties. The resulting polybenzoxazole resin had a number-average molecular weight (Mn) of 34000 obtained in terms of polystyrene using GPC manufactured by Toso Co., Ltd.

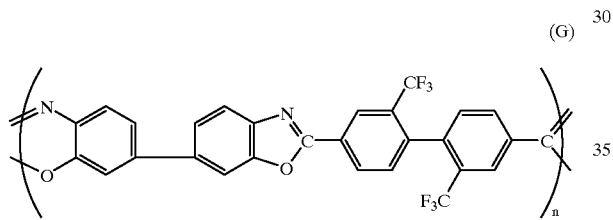

(G)

EXAMPLE 3

A polybenzoxazole resin (formula (H)) was prepared in the same manner as in Example 1, except that 51.6 parts (0.2 mol) of 2,2'-bis(3-amino-4-hydroxyphenyl)propane was used in place of 73.2 parts (0.2 mol) of 2,2'-bis(3-amino-4-hydroxyphenyl)hexafluoropropane in Example 1, and was evaluated on the properties. The resulting polybenzoxazole resin had a number-average molecular weight (Mn) of 54000 obtained in terms of polystyrene using GPC manufactured by Toso Co., Ltd.

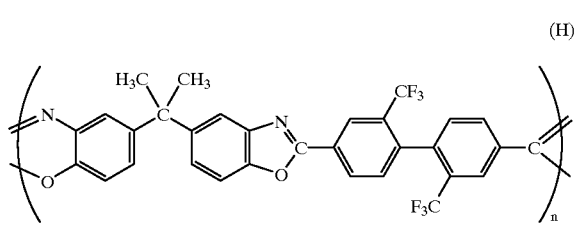

(H)

EXAMPLE 4

A polybenzoxazole resin (formula (I)) was prepared in the same manner as in Example 1, except that 56.1 parts (0.2 mol) of 3,3'-diamino-4,4'-dihydroxydiphenyl sulfone was used in place of 73.2 parts (0.2 mol) of 2,2'-bis(3-amino-4-hydroxyphenyl)hexafluoropropane in Example 1, and was evaluated on the properties. The resulting polybenzoxazole resin had a number-average molecular weight (Mn) of 41000 obtained in terms of polystyrene using GPC manufactured by Toso Co., Ltd.

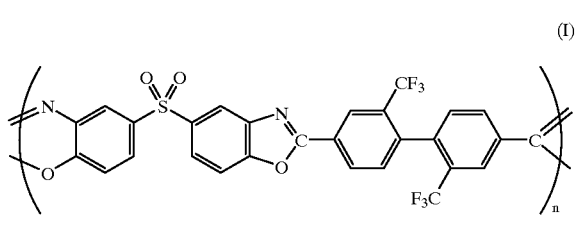

(I)

EXAMPLE 5

A polybenzoxazole resin (formula (J)) was prepared in the same manner as in Example 1, except that 46.4 parts (0.2 mol) of 3,3'-diamino-4,4'-dihydroxydiphenyl ether was used in place of 73.2 parts (0.2 mol) of 2,2'-bis(3-amino-4-hydroxyphenyl)hexafluoropropane in Example 1, and was evaluated on the properties. The resulting polybenzoxazole resin had a number-average molecular weight (Mn) of 52000 obtained in terms of polystyrene using GPC manufactured by Toso Co., Ltd.

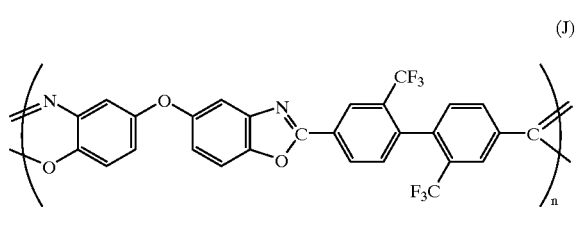

(J)

COMPARATIVE EXAMPLE 1

A polybenzoxazole resin (formula (K)) was prepared in the same manner as in Example 1, except that 40.6 parts (0.2 mol) of isophthalic acid chloride was used in place of 83.0 parts (0.2 mol) of 2,2'-bis(trifluoromethyl)-4,4'-biphenylenedicarboxylic acid chloride in Example 1, and was evaluated on the properties. The resulting polybenzoxazole resin had a number-average molecular weight (Mn) of 44000 obtained in terms of polystyrene using GPC manufactured by Toso Co., Ltd.

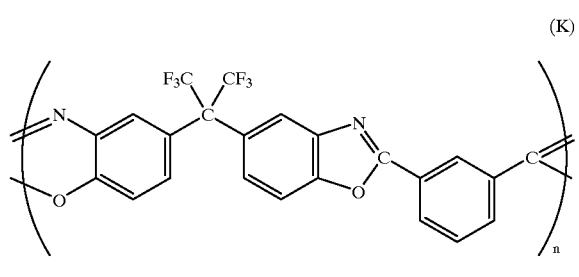

(K)

COMPARATIVE EXAMPLE 2

A polybenzoxazole resin (formula (L)) was prepared in the same manner as in Example 1, except that 46.2 parts (0.2 mol) of 4,4'-biphenylenedicarboxylic acid chloride was used in place of 83.0 parts (0.2 mol) of 2,2'-bis(trifluoromethyl)-4,4'-biphenylenedicarboxylic acid chloride in Example 1, and was evaluated on the properties. The resulting polybenzoxazole resin had a number-average molecular weight (Mn) of 49000 obtained in terms of polystyrene using GPC manufactured by Toso Co., Ltd.

(L)

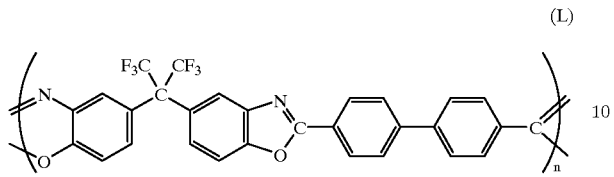

The evaluation results in the above Examples and Comparative Examples are shown in Table 1.

TABLE 1

| | Dielectric constant | Heat resistance (° C.) | CTE (×10$^{-6}$) | Water absorption (%) |
|---|---|---|---|---|
| Example 1 | 2.5 | 511 | 42 | 0.1 |
| Example 2 | 2.9 | 522 | 10 | 0.2 |
| Example 3 | 2.7 | 515 | 41 | 0.1 |
| Example 4 | 2.8 | 518 | 40 | 0.2 |
| Example 5 | 2.8 | 514 | 41 | 0.1 |
| Comparative Example 1 | 2.8 | 505 | 51 | 0.2 |
| Comparative Example 2 | 2.9 | 512 | 45 | 0.2 |

Dielectric constant: was measured at a frequency of 1 MHz by use of HP-4284A Precision LCR meter made by Hewlett-Packard Co. in accordance with JIS-K 6911.
Heat resistance: Temperature at which the weight reduced by 5%, was measured at a heating rate of 10° C./min. in nitrogen gas flow by use of TG/DTA 220 meter made by Seiko Denshi Kogyo K.K.
CTE: Coefficient of thermal expansion in the range of 25–100° C. was measured at a heating rate of 5° C./min. by use of TMA/SS120C meter made by Seiko Denshi Kogyo K.K.
Water absorption: Water absorption at a temperature of 85° C. and a humidity of 85% for 24 hours was measured by the weight method.

As clear from Table 1, the polybenzoxazole resins of the present invention showed excellent thermal characteristics, electrical characteristics, mechanical characteristics and physical characteristics. Therefore, they can be used as layer insulation films and protective films for semiconductors, layer insulation films of multilayer circuits, cover coats of flexible copper-clad sheets, solder resist films, liquid crystal-aligned films, etc.

What is claimed is:

1. A polybenzoxazole precursor having recurring units represented by formula (A):

(A)

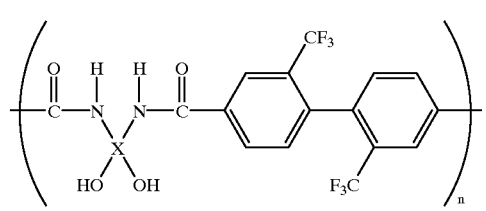

wherein n denotes an integer of 2–1000 and X denotes a structure having a formula selected from the group consisting of formulas (B):

(B)

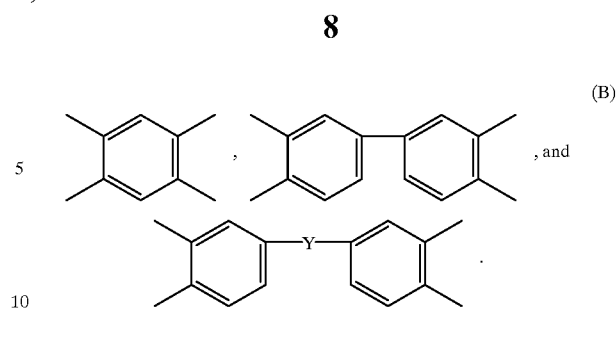

wherein Y denotes a structure having a formula selected from the group consisting of formulas (C), and the hydrogen atom(s) on the benzene ring in these structures are optionally substituted with at least one group selected from the group consisting of methyl group, ethyl group, propyl group, isopropyl group, butyl group, isobutyl group, t-butyl group, fluorine atom and trifluoromethyl group:

(C)

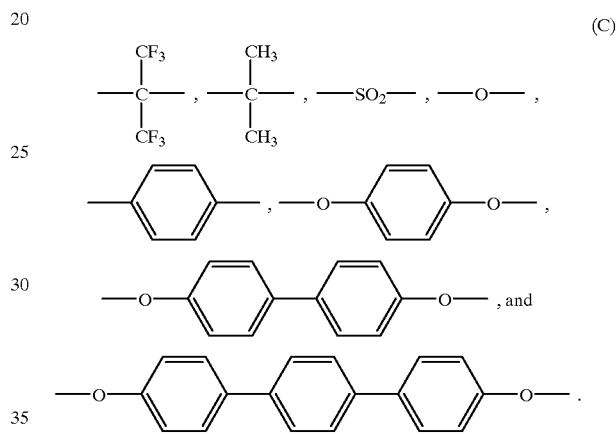

2. A polybenzoxazole resin having recurring units represented by formula (D):

(D)

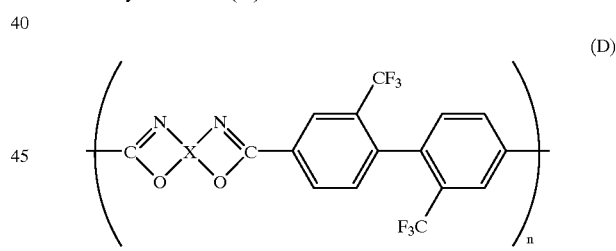

wherein n denotes an integer of 2–1000 and X denotes a structure having a formula selected from the group consisting of formulas (B):

(B)

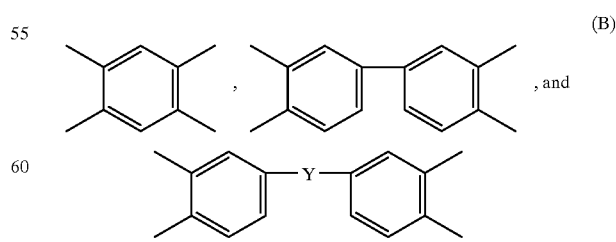

wherein Y denotes a structure having a formula selected from the group consisting of formulas (C), and the hydrogen atom(s) on the benzene ring in these structures are optionally substituted with at least one group selected from the group consisting of methyl group, ethyl group, propyl group, isopropyl group, t-butyl group, fluorine atom and trifluoromethyl group:
(C)
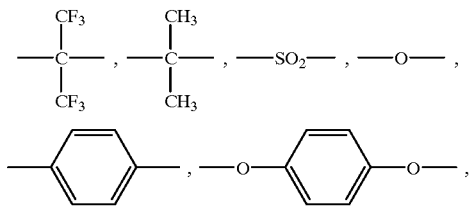
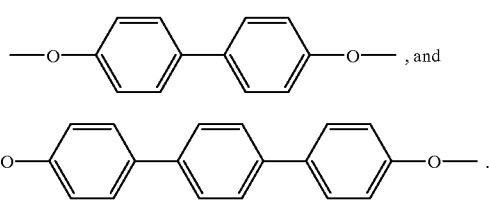, and
* * * * *